United States Patent [19]
Liu

[11] Patent Number: 5,738,756
[45] Date of Patent: Apr. 14, 1998

[54] METHOD AND APPARATUS FOR DETECTING OPTIMAL ENDPOINTS IN PLASMA ETCH PROCESSES

[75] Inventor: Alexander F. Liu, San Jose, Calif.

[73] Assignee: Lam Research Corporation, Freemont, Calif.

[21] Appl. No.: 497,461

[22] Filed: Jun. 30, 1995

[51] Int. Cl.$^6$ .............................. H01L 21/00; G01B 9/00
[52] U.S. Cl. .................. 156/627.1; 156/345; 156/643.1; 204/192.33
[58] Field of Search .................. 156/626.1, 627.1, 156/345; 204/192.33

[56] References Cited

U.S. PATENT DOCUMENTS

| | | | |
|---|---|---|---|
| 4,491,499 | 1/1985 | Jerde et al. | 156/626 |
| 4,680,084 | 7/1987 | Heimann et al. | 156/626 |
| 4,936,967 | 6/1990 | Ikuhara et al. | 204/192.33 |
| 5,002,631 | 3/1991 | Giapis et al. | 156/643 |
| 5,014,217 | 5/1991 | Savage | 364/498 |
| 5,118,378 | 6/1992 | Moroi et al. | 156/345 |
| 5,160,402 | 11/1992 | Cheng | 156/627 |
| 5,160,422 | 11/1992 | Cheng | 156/627 |
| 5,190,614 | 3/1993 | Leach et al. | 156/626 |
| 5,343,412 | 8/1994 | Birang | 364/572 |
| 5,405,488 | 4/1995 | Dimitrelis et al. | 156/627 |

FOREIGN PATENT DOCUMENTS 5-33818  5/1993  Japan .

*Primary Examiner*—R. Bruce Breneman
*Assistant Examiner*—Michael E. Adjodha
*Attorney, Agent, or Firm*—Irell & Manella LLP

[57] ABSTRACT

An improved method for specifying and reliably detecting endpoints in processes such as plasma etching, where the signal-to-noise ratio has been severely degraded due to factors such as "cloudy window" and low ratio of reactive surface area to non-reactive surface area. The improved method of the invention samples signals produced by photo sensitive equipment, digitally filters and cross-correlates the data, normalizes the data using an average normalization value, and provides further noise reduction through the use of three modes of endpoint specification and detection. The three modes of endpoint specification and detection require a pre-specified number of consecutive samples to exhibit a certain behavior before the endpoint is deemed detected and the process terminated as a result. The three modes of endpoint specification and detection also permit a very fine control of the etch time by permitting the user to adjust the specified endpoint by gradations of the sampling period. The improved method of the invention is capable of being implemented on known apparatus.

26 Claims, 12 Drawing Sheets

METHOD AND APPARATUS FOR DETECTING OPTIMAL ENDPOINTS IN PLASMA ETCH PROCESSES

BACKGROUND OF THE INVENTION

1. Field of the Invention

The present invention relates to plasma or dry etching of semiconductor wafers, and more particularly to detecting the optimal point during the etching process at which to terminate the process (i.e. the endpoint).

2. Background of the Related Art

Plasma or dry etching of semiconductor wafers is well-known in the semi-conductor processing art. The plasma or dry etch process is a process by which one or more layers of chemical species which have been either deposited or grown on the surface of a silicon wafer or other workpiece are removed or liberated from the surface of the wafer in those areas which are not protected by a layer of exposed photo-resist that is impervious to the etching process.

The wafers are typically disposed in a sealed chamber the interior of which is held at a pressure which is substantially below that of the atmosphere. One or more gases are introduced into the chamber which are highly reactive with the chemical constituents of the layer to be etched when the gases are ionized. As gas ionization source (typically R.F. energy) generates a plasma consisting of chemically active and charged species (~10E12 cm$^3$), whereafter the chemically active and charged species in the plasma impinge on the workpiece and react, dislodge, or otherwise cause material to be removed or volatilized from the workpiece and evacuated from the process chamber via a vacuum pumping arrangement.

As the plasma reacts with the unprotected layer, new compounds and/or species evolve from the surface of the wafer in the form of ions free radicals or volatilize gases. Certain of these species are elevated to higher energy states and emit photons as they fall back to a lower energy state. The photo emission for each of the species has a unique frequency which can be detected to indicate the presence of that species. The intensity of the photo emissions are directly proportional to the amount of the particular species that is present in the chamber.

It is critical to stop the plasma or dry etch process at the point where the layer to be etched has been completely removed from the surface and before the process begins to etch away the underlying layers. Otherwise, optimal operation of the resulting semiconductor circuits will not be realized. In fact, the integrated circuits assembled from the wafer may not operate at all.

Methods and apparatus for detecting an endpoint for plasma or dry etch processes have been implemented in the past. These methods and apparatus typically employ optical detectors and/or monochrometers to detect the optical emissions of one or more of the evolving species to determine the point at which those species either disappear from the chamber or begin to appear in the chamber; this is the point at which one layer has been etched away and/or the surface of an underlying layer has been reached. The monochrometers and/or optical detectors are coupled to a window of the chamber and they measure the intensity of light at specific frequencies to which they are tuned. The monochrometers and data detectors produce an analog voltage the amplitude of which is proportional to the concentration of a species in the chamber to which they are tuned. In a prior art method, the analog signals are converted to digital representations, processed and compared to a threshold level which, when reached or surpassed, serves to indicate an endpoint.

As the feature sizes of semiconductor processes have decreased to the sub-micron level, however, situations often exist where the amount of exposed area of a particular layer to be etched falls well below 5% of the total surface area of the wafer. Thus, the intensity of the optical emissions for a particular species becomes so low that they are lost in the noise generated by the system. The signal-to-noise ratio becomes so low that currently known methods of filtering the noise to identify the signals of interest are not sufficient to permit an appropriate endpoint of the etching process to be accurately and reliably detected. Furthermore, as the number of wafers processed by a particular etching apparatus becomes large, deposits on the window through which the optical emissions are viewed and detected further reduces the intensity of the signals of interest, thereby further exacerbating the shrinking signal-to-noise ratio.

Therefore, there is a need in the art of plasma or dry etching of semiconductor wafers for an improved method which can properly and reliably detect endpoints for plasma or dry etching processes operating under conditions where the exposed surface area of the layer to be etched on, for example, a semiconductor wafer falls well below 5% (to at least as low as 0.8%) of the total surface area of the wafer, and where "cloudy window" problems further exacerbate the low signal-to-noise ratio. This new and improved method of endpoint detection should also be readily adapted to all existing and future etching apparatus, and should be applicable to any of the various surface layers which are commonly etched using a plasma or dry etch process. Finally, the method should be capable of facilitating optimization of endpoint detection for a given etching process by providing for fine adjustment of the endpoint and the ability to select the optimal endpoint using empirical results recorded from previous process runs.

SUMMARY OF THE INVENTION

The invention has application to plasma or dry etch processing systems to specify an optimal endpoint and to accurately and reliably detect that optimal endpoint even under conditions producing extremely low signal-to-noise ratio. One or more optical detectors and/or monochrometers are coupled through a bundle of optical fibers to an optical lens which is mounted on a window to the etching chamber of a plasma etch system. The outputs of the optical detectors and/or monochrometers are coupled to an analog multiplexer (MUX) which is in turn coupled to an analog-to-digital converter (ADC). The output of the ADC is then optically coupled to a microcontroller which includes a CPU, memory, and input/output (I/O) ports. Each optical detector and/or monochrometer is tuned to the characteristic frequency of light emitted by a particular chemical species which is evolved during the etching process to be controlled. The analog MUX samples the analog output voltage signal generated by each optical detector and/or monochrometer at a pre-established sampling rate, and feeds the sampled value of those analog signals into the ADC as a set. The ADC converts each of the set of the analog signals into digital representations which are then fed to the microcontroller. The microcontroller is programmed to process the set of digital raw data samples using the improved method of the present invention to detect that point at which the etching process should be ended (i.e. the endpoint).

Prior to the commencement of the etching process, one or more optical detectors and/or one or more monochrometers are assigned to detect the unique frequency of light emitted by one or more chemical species evolved by the etching process to be controlled. Each optical detector and/or monochrometer is assigned to a specific channel of the system. At the commencement of the etching process, the optical detectors and/or monochrometers begin producing analog signals, the magnitude of which are directly proportional to the amount of light being emitted at the frequency to which they have been tuned. The analog MUX then samples the output of each of the active channels at a fixed periodic rate called the sampling rate. Thus, beginning at a time t which represents the start of a sampling period Ts, each of the channel outputs are sequentially coupled to the ADC which converts the analog voltage signal to a digital value which is directly proportional to the magnitude of the analog voltage. This set of digital values for time t are then input into the microcontroller and processed in accordance with the method of the present invention in real time. Thus, a set of raw data samples are produced for each sampling period, one from each of the channels, and they are processed as a set by the method of the present invention.

Each raw data sample D of the captured set of samples from the active channels at time t is first subjected to a pre-filtering process by the microcontroller. The pre-filtering process produces a set of filtered data samples for each active channel at a time t in accordance with the following equation: $Df1(t)=(1-Q1) \times Df1(t-1)+Q1 \times D1(t)$, where $Df1(t)$ is the pre-filtered data of one of the channels at time t, $Df1(t-1)$ is the pre-filtered data of the channel at a time t-1, $D(t)$ is the raw data sample of the channel at time t and Q1 is the pre-filter filter constant.

For a fixed time $t_D$, the microcontroller ignores the pre-filtered data for all samples for $t<t_D$. Time $t_D$ is known as the delay or masking time. For a second time period $t_D<t<t_N$, an average normalization value $D_{an}$ is calculated. For $t_D<t<t_N$, the pre-filtered data samples $Df1(t)$ for each of the active channels are summed and the sum is then divided by the total number of samples N captured during the period of time $t_D<t<t_N$. For $t>t_N$, each of the pre-filtered data samples $Df1(t)$ for each of the active channels is divided by the average normalization value $D_{an}$ calculated for that active channel, which produces a normalized value $Y(t)$ which is expressed as a percentage of the normalization value $D_{an}$ of that channel.

The set of normalized values $Y(t)$ calculated for each channel for a time $t>t_N$ are then cross-correlated to produce a single multiple channel value $MCA(t)$ which represents a cross-correlated combination of the normalized values $Y(t)$ for each of the active channels at time t. The channels are combined in accordance with the following equation: $MCA(t)=[(A-B)+(C-D)]+(E)$ where A, B, C, D and E can be assigned to represent up to five active channels.

Each of the cross-correlated values $MCA(t)$ is then subjected to a post-filtering process in accordance with the following equation: $Df2(t)=(1-Q2) \times Df2(t-1)+Q2 \times MCA(t)$, where $Df2(t)$ is the post-filtered value of $MCA(t)$, $Df2(t-1)$ is the post-filtered value of $MCA(t-1)$, $MCA(t)$ is the cross-correlated value of the normalized values $Y(t)$ of each of the active channels at time t and Q2 is the post-filter filter constant.

The microcontroller then compares the post-filtered values $Df2(t)$ (or the derivatives of those values) to a specified threshold value. Once the threshold has been exceeded, the microcontroller determines when the specified endpoint of the process has been reached. The user specifies whether amplitude (i.e. $Df2(t)$ or slope mode (i.e. $dDf2(t)/dt$) is used to detect the endpoint prior to initiating the etching process.

The endpoint can be specified by one of three Modes. Mode 1 specifies the endpoint as the point at which some certain number of values (k) of $Df2(t)$ (or $dDf2(t)/dt$) exceed a specified threshold and consecutively increase in magnitude. Mode 2 specifies the endpoint as that point at which a certain number of values (k) of $Df2(t)$ (or $dDf2(t)/dt$) exceed a specified threshold and have consecutively decreased from a peak of those values. Mode 3 specifies the endpoint as the point at which a specified number of values (k) of $Df2(t)$ (or $dDf2(t)/dt$) are below a specified threshold and are consecutively decreasing, but only after $Df2(t)$ (or $dDf2(t)/dt$) has at least once exceeded the specified threshold.

The step which defines the endpoint using one of the three modes permits an additional level of filtering such that false peaks created by noise, which may exceed the threshold for some very small period of time, will not cause the process to be ended prematurely by detection of a false endpoint. Furthermore, the step specifying the endpoint using one of the three modes permits a process engineer to fine-tune the endpoint to one that is shown to be optimal for producing operative semiconductor circuits through empirical data gathered by the method and apparatus of the invention during prior process runs.

DETAILED DESCRIPTION OF THE INVENTION

1. Introduction

The present invention is an improved method of detecting the optimal point at which a plasma or dry etch process should be terminated under circumstances where the signal-to-noise ratio is extremely low. Also disclosed is an apparatus for implementing the improved method of the invention. In the following description, a known apparatus is first described which is capable of implementing the improved method of the present invention. Second, a previously known method is described which was not capable of establishing and detecting an optimal endpoint once the exposed area of a wafer to be etched fell much below 3% of the total surface area of the wafer. Finally, the improvements to the known process are disclosed which enable the improved process of the present invention to establish and reliably identify an endpoint where the exposed area is at least as low as 0.8% of the total surface area. In addition, numerous specific details are set forth such as exemplary hardware configurations to provide a thorough understanding of the present invention. It will be apparent to one skilled in the art, however, that the present invention may be practiced without the specific details.

In other instances, well-known circuits and structures are not described in detail in order not to obscure the present invention unnecessarily. For example, the details of known components such as optical detectors and monochrometers and the interface of those components to the window of an etching chamber are not provided in detail. Those who are skilled in the art will recognize that these components are widely applied for purposes of detecting optical emissions, including those within the etching chambers of plasma etch machines. Likewise, those of skill in the art will recognize that there are many techniques for multiplexing analog signals and converting them to digital signals and therefore the details of these components are also not shown or discussed in any detail. Finally, there are also many well known techniques for processing digital data which include microcontrollers, microprocessors, and other forms of data processing devices. Those of skill in the art will recognize that the implementation details of the microcontroller used to process sampled data in accordance with the method of the present invention are well known and not relied upon for the patentability of the present invention.

Those of skill in the will further recognize that the method and apparatus of the present invention can be applied in any context which requires the detection of photo emissions which are obscured by noise in the system. Thus, although the method and apparatus of the present invention are discussed in the context of determining endpoints for plasma etch processing of semiconductor wafers, other similar applications, such as vapor deposition processes, are also contemplated to be within the scope of this application.

2. Apparatus of the Invention

Figure 1:
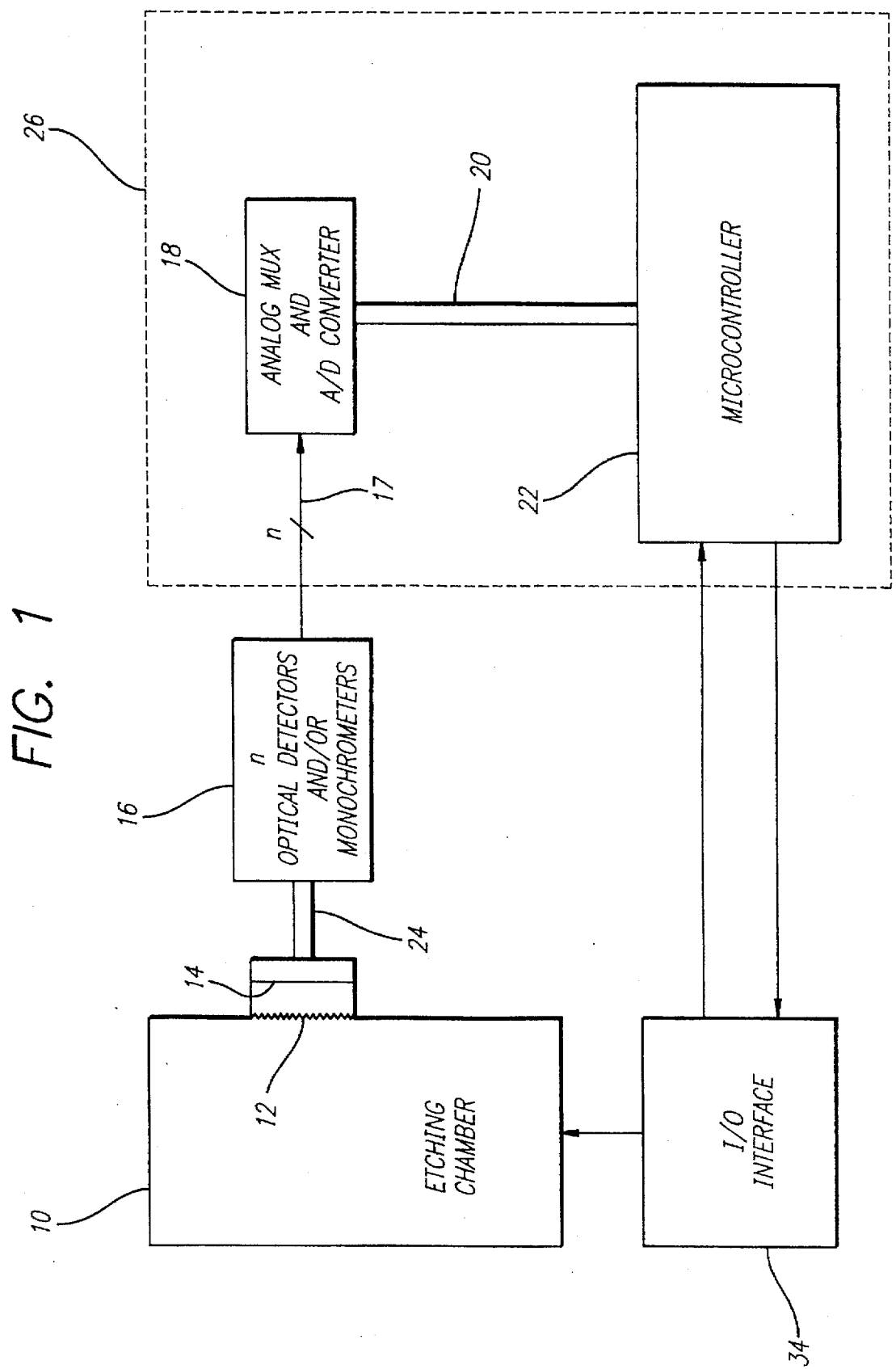
FIG. 1 is a block diagram representation of an apparatus employing the method of the present invention.

Referring now to FIG. 1, a block diagram representation of an apparatus capable of implementing the method of the present invention is illustrated. The inputs to n optical detectors and/or monochrometers 16 is coupled to an optical lens 14 through optical connector 24. Optical lens 14 is mounted over window 12 of etching chamber 10. Etching chamber 10 forms part of a plasma or dry etch system which is commonly known in the art.

Those of skill in the art will recognize that the selection of optical detectors versus monochrometers is based primarily on the types of species to be detected during the process. Monochrometers are often used when etching oxide, whereas optical detectors are often used when etching metal. In the preferred embodiment of the apparatus of the present invention, two monochrometers and three optical detectors are typically employed. The two monochrometers and two of the optical detectors can be employed to detect specific species depending upon the etching process being performed. The third optical detector is typically used in conjunction with a broadband filter in order to sense all optical emissions produced by the process. Thus, five data channels are preferably employed in the preferred embodiment, although additional channels can easily be added.

Upon commencement of the etching process, any of the N optical detectors and/or monochrometers which are assigned to and tuned for a particular species evolved by the particular process application, begin producing analog voltages the magnitude of which are directly proportional to the intensity of the photo emissions produced by the species to which they have been tuned. The outputs of the optical detectors and/or monochrometers 16 are coupled by way of connectors 17 to the input of an analog multiplexer and analog to digital converter (ADC) 18. The analog MUX samples the analog signals being transmitted over the active channels at a pre-specified sampling rate and these samples are converted by the ADC to digital values which are directly proportional to the amplitude of the sampled analog voltages. Thus, if there are five active channels during the etching process, analog MUX and ADC 18 produces five digital values per sampling period, one for each of the five channels. The raw digital data is then serially transmitted over an optical coupler 20 to microcontroller 22.

Microcontroller 22, which can be, for example, an 8-bit microcontroller such as the Intel 8045, then processes the raw data for each sampling period in accordance with the method of the present invention. When an endpoint has been detected by the microcontroller 22 in accordance with the method of the present invention, the microcontroller 22 shuts down the ionizing energy source being provided to the etching chamber 10 through input/output (IO) interface 34. The etching process ceases virtually immediately upon removal of the ionizing energy source.

Figure 2:
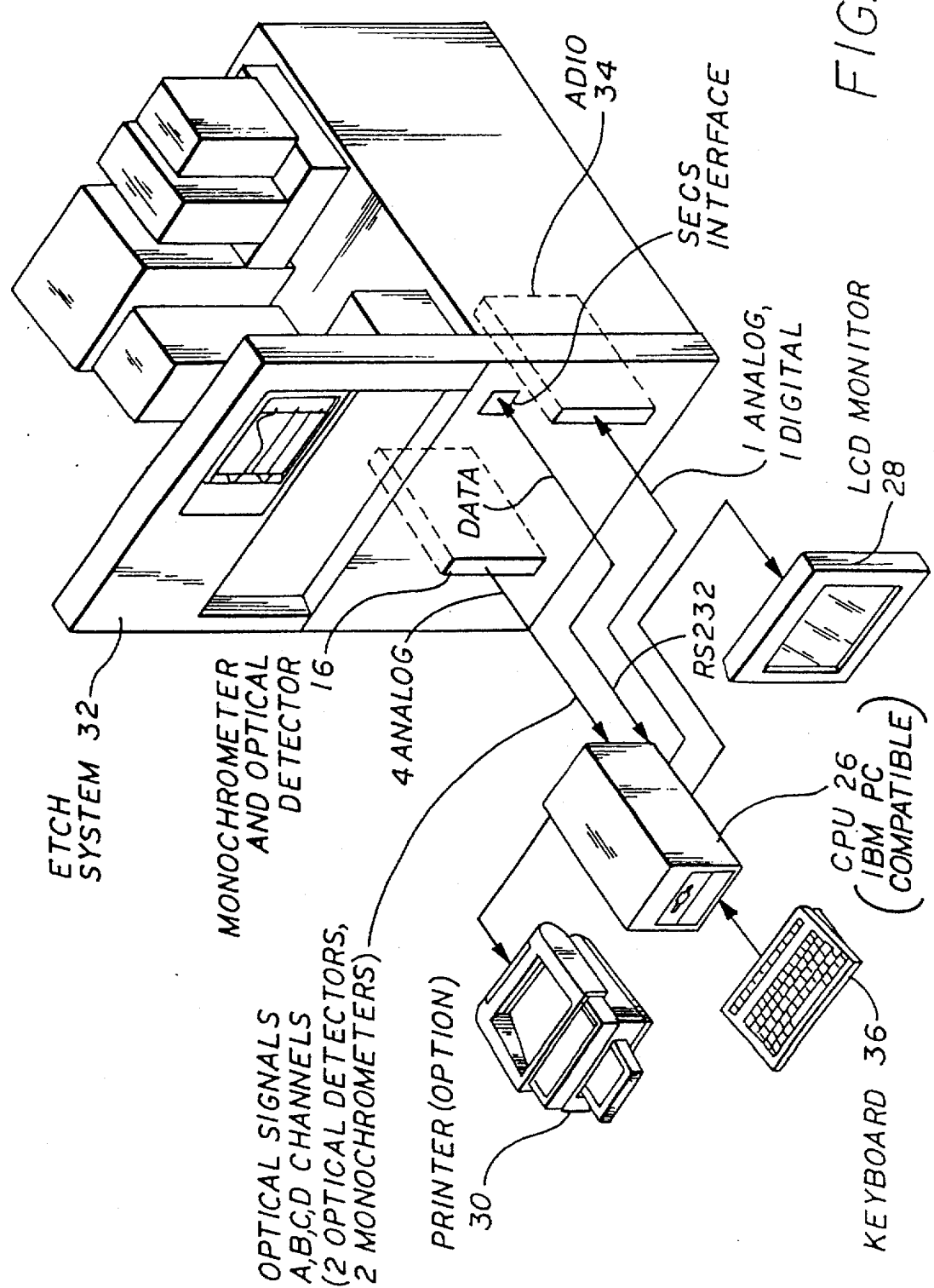
FIG. 2 is a depiction of an apparatus employing the method of the present invention.

FIG. 2 illustrates a schematic diagram of an embodiment of the apparatus of the present invention. CPU 26 includes the analog MUX and ADC 18, optical coupler 20 and microcontroller 22. Monochrometer and/or optical detectors 16 are shown coupled through connector 17 to CPU 26. CPU 26 is also coupled to I/O interface 34 which resides inside the plasma etch system 32. In support of CPU 26, an LCD Monitor 28, a printer 30, and keyboard 36 are also provided.

3. Prior Art Method

Figure 3:
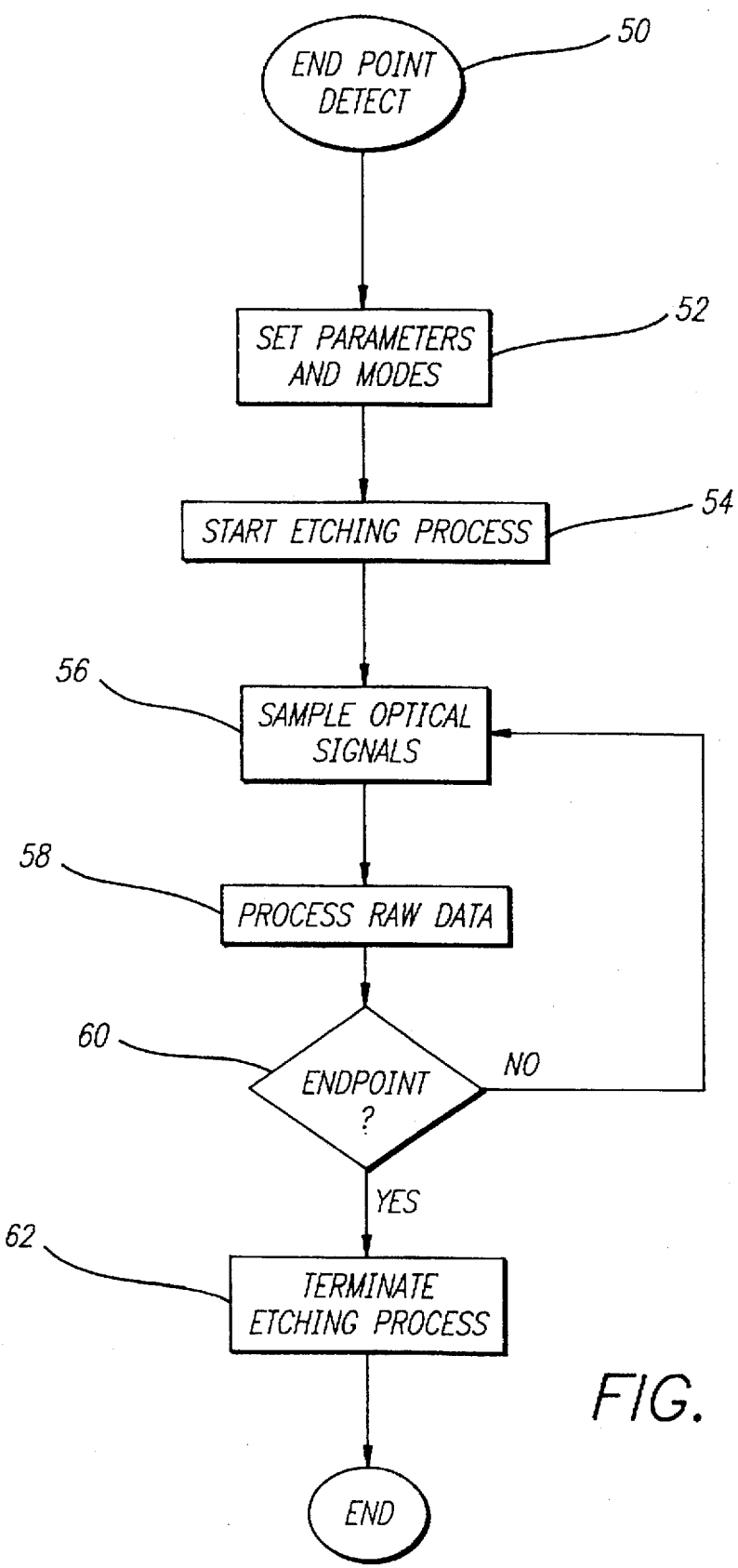
FIG. 3 is a high-level flow chart representation of a prior art method and the method of the present invention.

With reference to FIGS. 3–6, a discussion of a previously known method of endpoint detection will now be presented. FIG. 3 illustrates a top level flow chart describing the steps employed by known methods of endpoint detection as well as the improved method of the present invention. Block 52 represents the steps taken by a user of an etching system such as a process engineer, to prepare the etching system to perform a particular etching process. A more detailed discussion of the parameters and modes which must be set, and the factors which influence the selection of those parameters and modes will be presented later.

Block 54 represents the step of initiating the etching process, at which time the analog MUX and ADC 18 begins to sample the raw data being produced on each of the assigned and active channels of the system. As previously discussed, for each sampling period a set of raw data values for each of the active channels is optically transmitted to the microcontroller which executes the Process Raw Data Routine 58. Once the set of raw data points has been processed, the resulting processed data is analyzed to determine whether an endpoint has been detected by the ENDPOINT? Routine 60. If the processed data does not reflect an endpoint (typically because it has not exceeded some pre-established threshold), the etching process continues and a new set of raw data is sampled and provided to the microcontroller for processing by Process Raw Data Routine 58. This loop continues until ENDPOINT? Routine 60 detects that an endpoint has been reached. At that time, the etching process is terminated by an output signal from the microcontroller as represented by Block 62 in FIG. 3.

Figure 4:
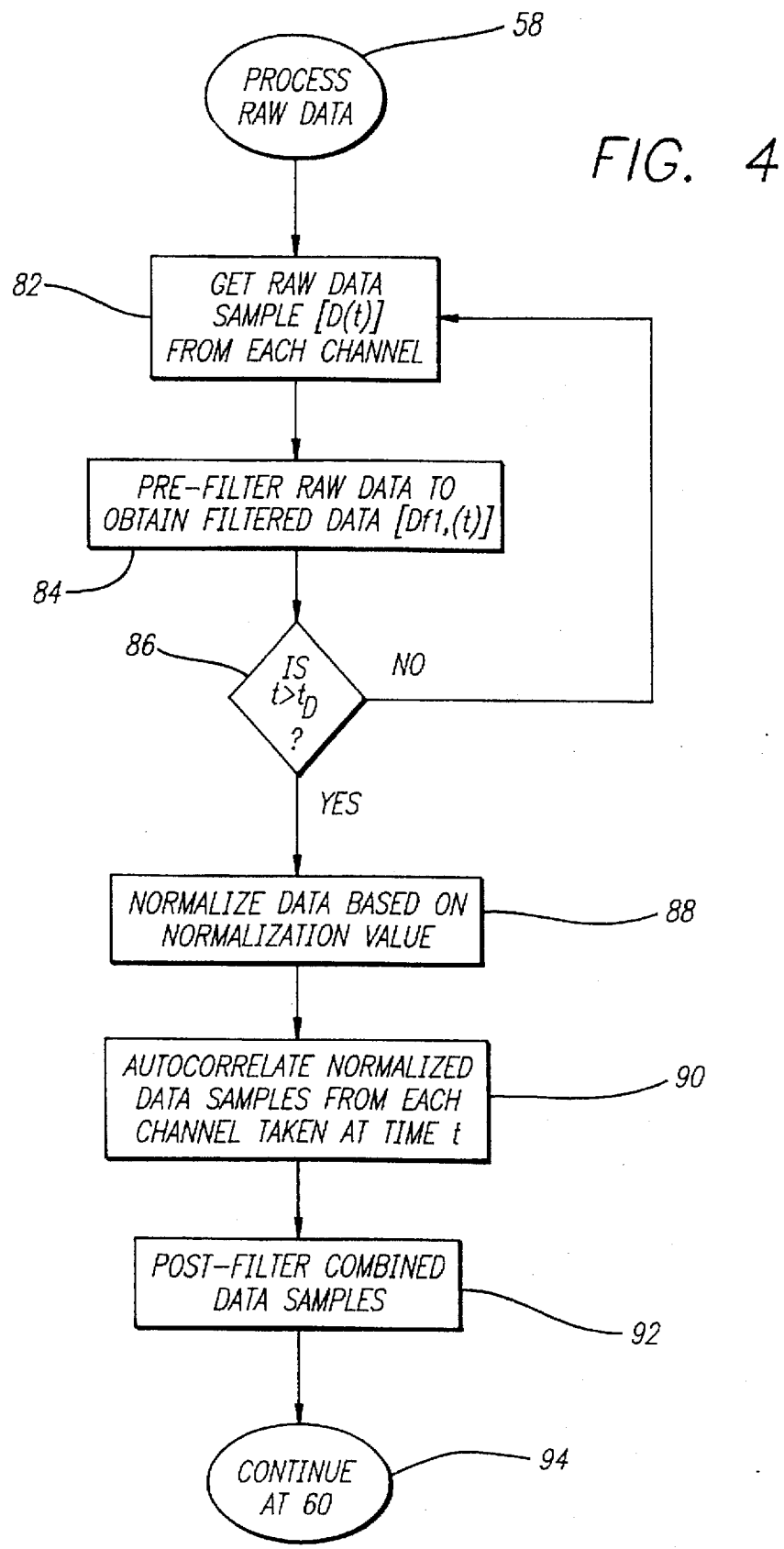
FIG. 4 is a high-level flow chart representation of the Process Raw Data Routine for a prior art method and the method of the present invention.

A more detailed discussion of the Process Raw Data Routine 58 is now presented with reference to FIG. 4. For each sampling period during the etching process, the microcontroller receives a set of raw data samples (one for each of the active channels) which is denoted as D(t). This step is represented by Block 82 of FIG. 4. The set of raw data points is then pre-filtered to obtain pre-filtered data samples Df1(t). A Df1(t) value is calculated for each active channel at a time t in accordance with the following equation: Df1(t)=(1−Q1)×Df1(t−1)+Q1×D1(t), where Df1(t) is the pre-filtered data of one of the channels at time t, Df1(t−1) is the pre-filtered data of the channel at a time t−1, D(t) is the raw data sample of the channel at time t and Q1 is the pre-filter filter constant. This step, represented by Block 84, is intended to eliminate some of the noise that is picked up during the sampling process.

Decision Block 86 represents the step of masking pre-filtered data from further processing for a period of time $t_D$, a period of time during which the endpoint is not expected but noise is typically very heavy due to initiation of the etching process. If the pre-established delay time $t_D$ has not yet lapsed, the routine loops back up to Block 82 at which time the microcontroller awaits a new set of raw data samples from the system. It will be recognized by those of skill in the art that the actual value of $t_D$ will vary for a particular etch process and can be set by a process engineer based on empirical data and experience. Once the masking period has elapsed, the routine proceeds to the next step represented by Block 88 during which a normalization value $D_n$ is established for each of the active channels by setting $D_n$ for each channel equal to the first pre-filtered data sample Df1(t) occurring for each channel after the masking time $t_D$ has elapsed (i.e. t>$t_D$). Once this normalization value $D_n$ has been established for each channel, each of the set of pre-filtered data samples captured during a particular sampling period are normalized by dividing the pre-filtered data samples Df1(t) by $D_n$ for each channel to obtain a normalized value Y(t) for each sample in the set which is expressed as a percentage of the normalized value.

It should be noted here that one of the improvements of the method of the present invention resides in the Normalize Data 88 step which will be discussed in more detail in the next subsection.

Once the set of normalized data samples for the current sampling period has been established, the normalized values Y(t) for each channel are auto-correlated (i.e. combined) to produce a single value MCA(t) for the set of normalized values for the current sample period. The single, auto-correlated value MCA(t) for the current sampling period is accomplished in accordance with the following equation: MCA(t)=[(A−B)+(C−D)]÷(E) where A, B, C, D and E can be assigned to represent up to five active channels.

For example, if only two channels were being employed for a particular etch process, those two channels would be assigned to A and B respectively. The remaining variables in the equation, C, D, and E, are set equal to 1, which means that the value for MCA(t) will equal A−B. It is well known in the art that the assignment of particular species to specific channels will serve to eliminate the common noise between the channels while accentuating the signals of interest. For example, the species assigned to channel 1 might be declining in concentration at the same time as the species assigned to channel 2 is increasing in concentration, both at the moment of time t when the endpoint is being reached. By assigning channel 1 to variable A and channel 2 to variable B, subtracting the two signals of interest from one another will actually be additive, while any noise common to both channels will be subtracted and negated. Further, the channel assigned to E is often an optical detector having a broadband filter which permits detection of all frequencies present in the chamber at any given time. Thus, by dividing the normalized value of the broadband channel, common noise may be further eliminated from the value of MCA(t). It will be recognized by those of skill in the art that there are a number of considerations that are well known in deciding which species are best used to detect an endpoint and to which channels the detectors tuned to those species should be assigned. These considerations are not relied upon for the patentability of the method and apparatus of the present invention.

The Process Raw Data Routine 58 then continues at Block 92 which post-filters the combined channel value MCA(t) to further eliminate noise from the signal of interest. The post-filter step establishes a post-filtered value Df2(t) in accordance with the following equation: Df2(t)=(1−Q2)×Df2(t−1)+Q2×MCA(t), where Df2(t) is the post-filtered value of MCA(t), Df2(t−1) is the post-filtered value of MCA (t−1), MCA(t) is the cross-correlated value of the normalized value Y(t) of each of the active channels at time t and Q2 is the post-filter filter constant.

This post-filtering process was, as was the pre-filtering step, added to this prior method in an attempt to deal with lower signal-to-noise ratios occurring for exposed areas falling under 5% of the entire surface area of the workpiece. Like the pre-filtering step 84, however, this step was not sufficient to permit reliable endpoint detection as the exposed surface areas decreased much below 5% of the total surface area. For exposed surface areas greater than 5%, Q2, as with Q1, can be set to 1. This eliminates the filtering function as can be seen from the equation. As the exposed surface area falls below 5% and continues to decrease, Q2, as with Q1, should have a value of <1. Those of skill in the art will recognize that the optimal value of Q2, as with Q1, will depend on the characteristics of the particular etch process being monitored. The value of Q2 (as well as Q1) can be optimized based on empirical data and experience of the operator of the etch system implementing the method.

Figure 6:
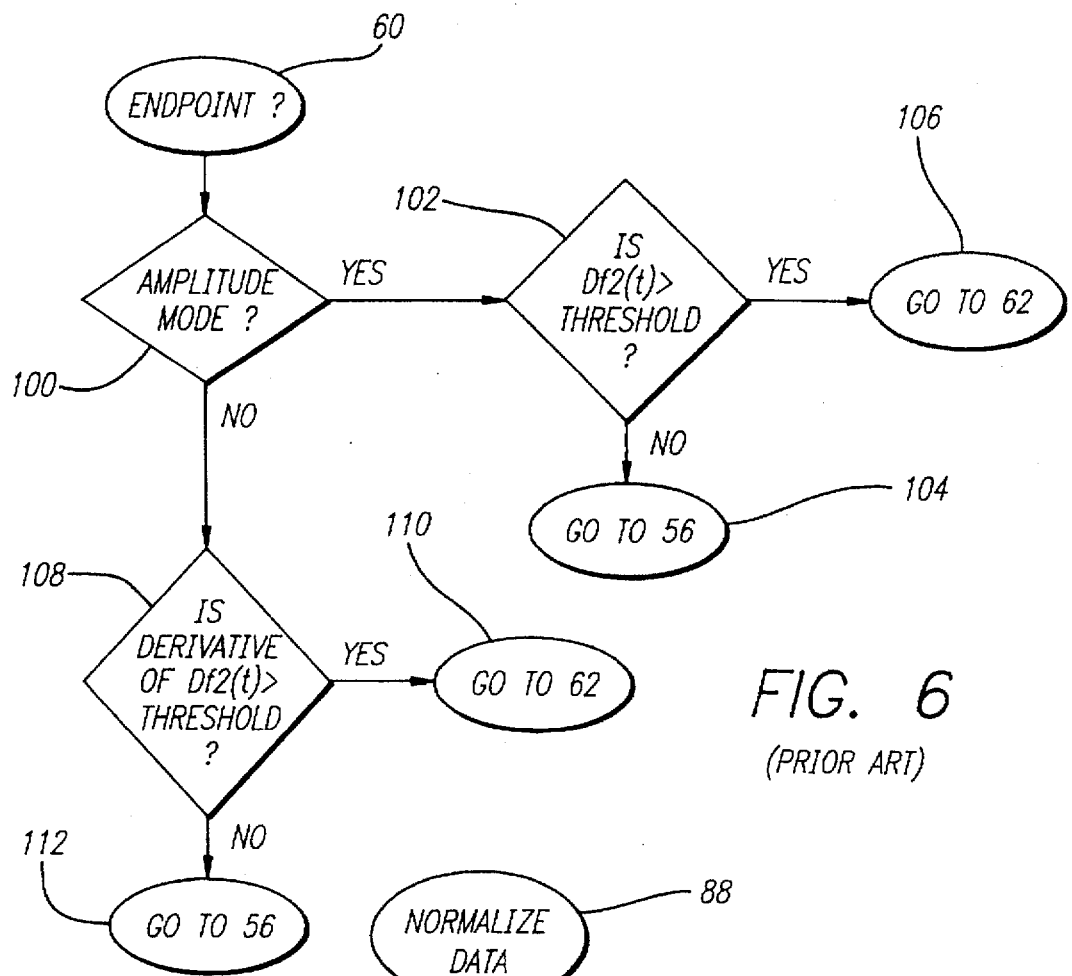
FIG. 6 is a flow chart representation of the ENDPOINT? Routine as employed in prior art methods of endpoint detection.

The Process Raw Data Routine 58 returns back to Endpoint Detect Routine 50 at Decision Block 60. At Decision Block 60, the prior art ENDPOINT? Routine 60 is then executed. FIG. 6 illustrates a flow chart representing the prior art ENDPOINT? Routine 60. At Decision Block 100, the microcontroller determines whether the endpoint is to be detected on the amplitude values of the post-filtered samples Df2(t), or the derivative (i.e., the slope) of those values. If amplitude mode is selected, the microcontroller proceeds to Decision Block 102 where the post-filtered value for the current sample period is compared to a preset threshold. If the value Df2(t) is greater than the pre-specified threshold, the process goes to Step 62 of the Endpoint Detect Routine 50 where the etching process is terminated by the microcontroller. Otherwise, the routine returns back to Step 56 of the Endpoint Detect Routine 50 where a new set of samples are input to the Process Raw Data Routine 58. If the amplitude mode is not selected, the derivative of the pre-filtered data Df2(t) is then compared to the specified threshold. If the derivative value is greater than the preselected threshold, the procedure returns to Step 62 of the Endpoint Detect Routine 50. If the derivative is less than the specified threshold, the procedure returns to Step 56 of the Endpoint Detect Routine 50 where a new set of samples is processed in accordance with the routine as previously described.

It should be pointed out here that the prior art method, including its ENDPOINT? Routine 60 depicted in FIG. 6, is not capable of accurately and reliably determining an endpoint when the exposed surface area of the wafer drops below about 3%. If the cloudy window problem is also present, the minimum exposed surface area may actually be higher. As will be discussed under the next subsection, the improved method of the present invention achieves reliable and accurate detection of endpoints to as low as a 0.8% exposed surface area, even when complicated by a cloudy window, by implementing a new ENDPOINT? Routine 60.

Figure 5:
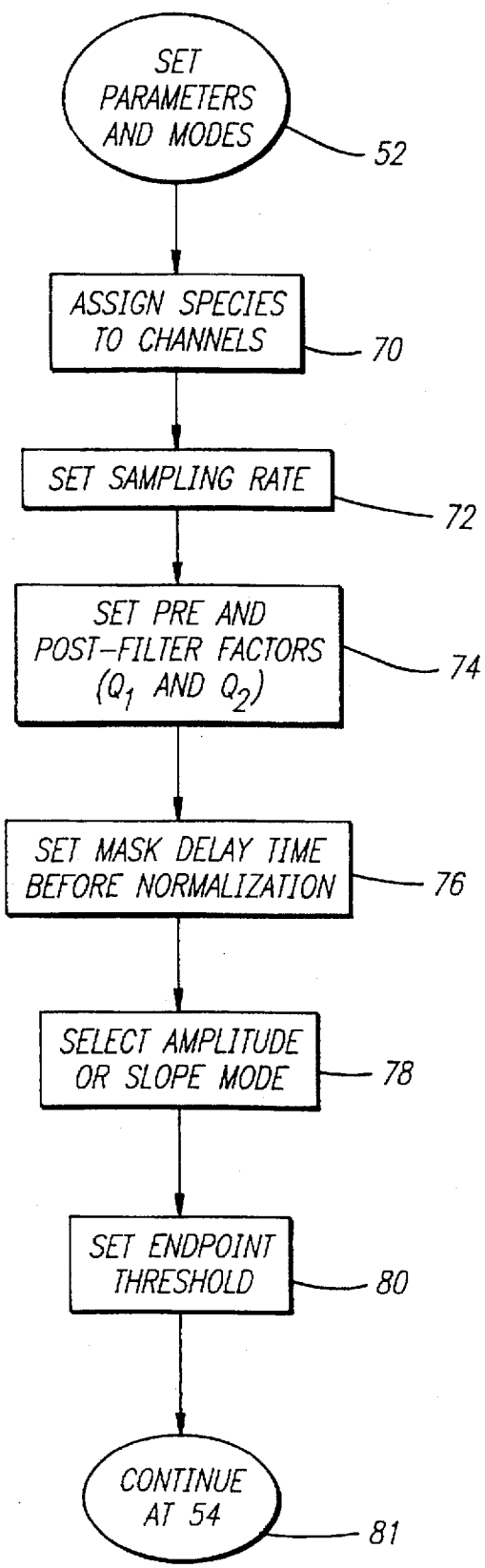
FIG. 5 is a flow chart representation of the Set Parameters and Modes Routine as employed in a prior art method.
Figure 9:
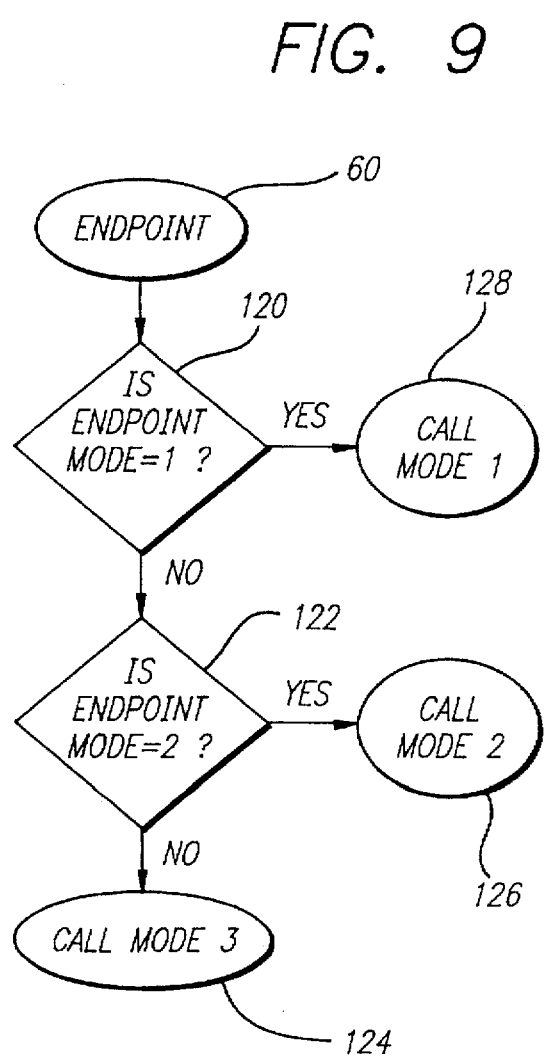
FIG. 9 is a flow chart representation of the ENDPOINT? Routine of the method of the present invention.

FIG. 5 illustrates the Set Parameters and Modes Routine 52 to illustrate the various tasks that must be performed by the process engineer in preparing the etch machine to perform an etch process under the prior art method. As previously discussed, the process engineer must first assign the critical species to the appropriate channels of the apparatus. A sampling rate must be specified, as well as the pre and post-filter factors (Q1 and Q2). The mask or delay time $t_D$ must be chosen based on the time necessary to permit the system to settle down after initiation of the etch process. The process engineer must also select between using the amplitude value produced by the post-filtering process (Df2(t)), or the derivative of that value (dDf2(t)/dt). Finally, the process engineer has to set a threshold level which, when exceeded by a current value of Df2(t) (or its derivative), indicates that an endpoint has been detected and that the etching process should be terminated. Those of skill in the art will recognize that these parameters and modes can be optimized for many different etching processes and such optimization can be accomplished by use of empirical data as well as experience.

4. Improved Method of the Invention

The improved method of the invention follows the same higher level flow charts of FIGS. 3 and 4 as the above-described prior art method. Improvements realized by the method of the present invention reside in the Set Parameters and Modes Routine 52 and the ENDPOINT? Routine 60 (see FIG. 3), as well as the Normalize Data Based on Normalization Value Routine 88 (see FIG. 4).

Figure 7:
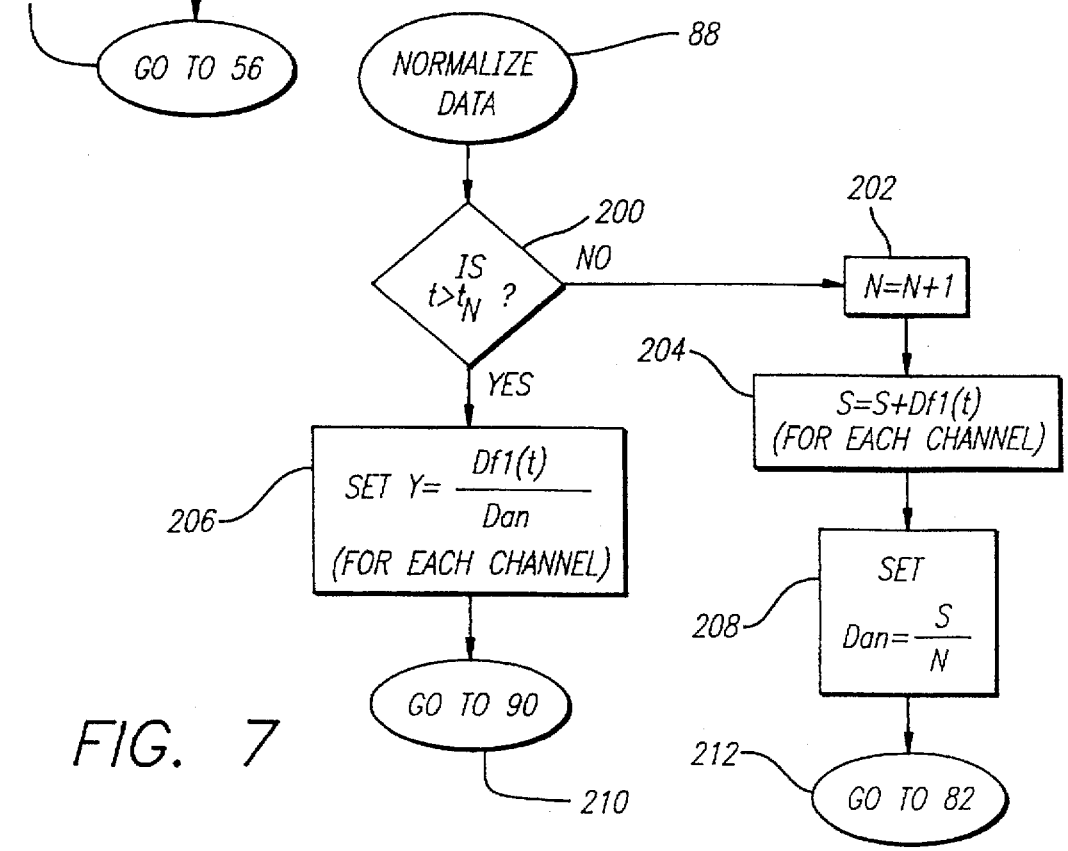
FIG. 7 is a flow chart representation of the Normalize Data Routine for the method of the present invention.

To further reduce the amount of noise obscuring the signal of interest under conditions causing low signal-to-noise ratio as previously described, the improved method of the invention calculates an average normalization value $D_{an}$ by which the pre-filtered data samples are normalized. The flow chart of FIG. 7 illustrates the Normalized Data Routine 88 of the present invention. This routine sums the filtered data values for each channel over a period of time t which is less than a time $t_N$ but greater than $t_D$. The routine sums the values of Df1(t) for each of the active channels and divides them by the total number of samples N which have been summed during that period of time $t_D < t < t_N$. The use of a normalization value averaged over a number of samples is in contrast to the above-referenced prior art method which uses only the very first value Df1(t) for each channel after the masking time $t_D$ has elapsed.

Figure 8:
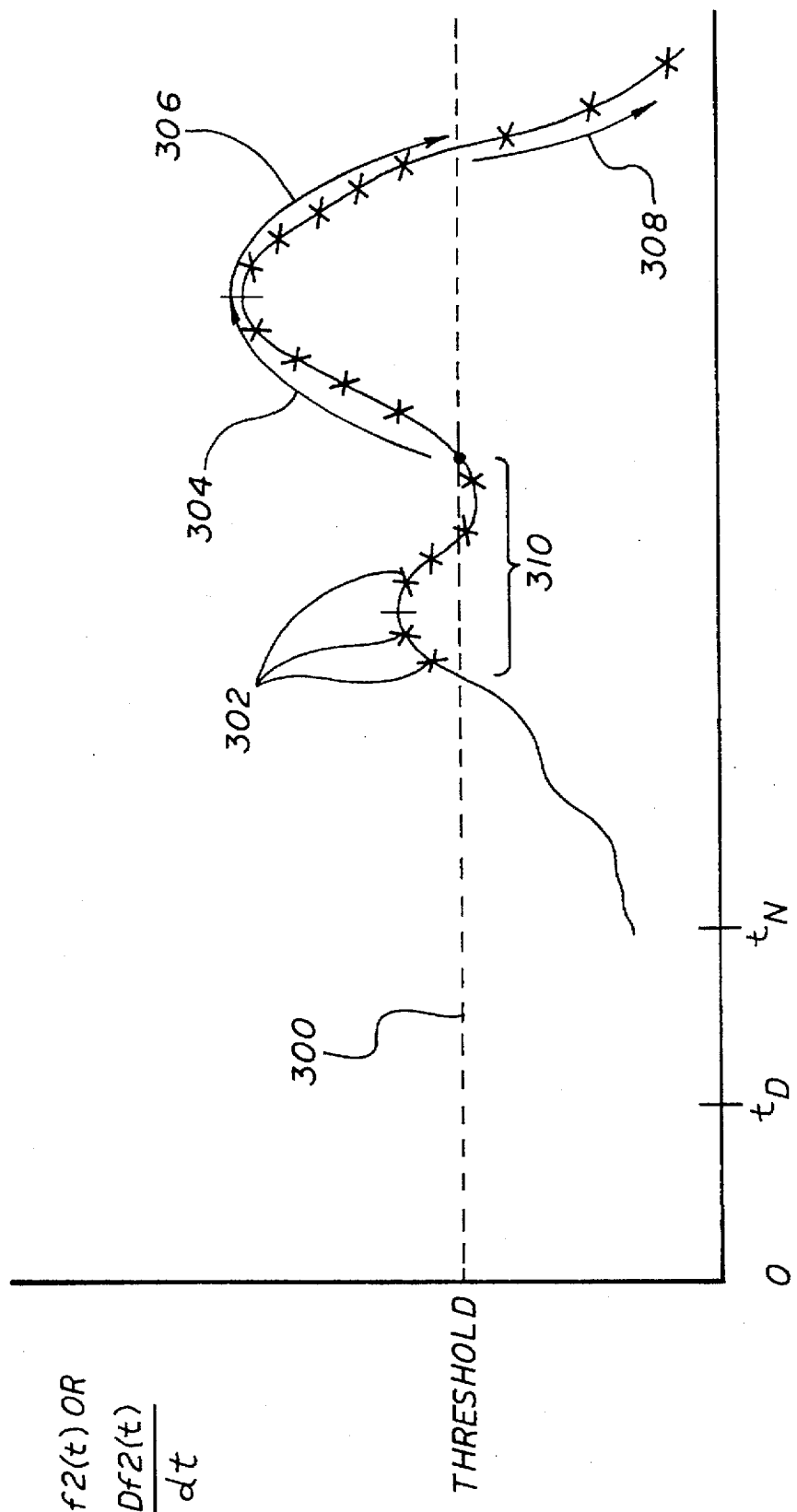
FIG. 8 is an illustration of the application of the endpoint detection scheme to a typical output from the post-filter step of the method of the present invention.

Decision Block 200 determines whether the time t has exceeded $t_N$ and, if it has, each pre-filtered data sample Df1(t) for each channel is then normalized using the average normalization value $D_{an}$ calculated for each of the channels. This step is represented by Block 206. Thus, the averaging of a number of pre-filtered data values for each active channel to determine the normalization value tends to average out the peaks and valleys which are caused by the noise which is obscuring the value of the signal of interest. Despite the pre and post-filtering steps of the prior art method, and the improved normalization step as described above, as the signal-to-noise ratio continues to decrease, noise continues to obscure the signal of interest to the extent that false endpoints can still be triggered if the ENDPOINT? Routine 60 of the prior art method is used. A detailed description of the new and non-obvious ENDPOINT? Routine 60 is now presented with reference to FIGS. 8 through 14. FIG. 8 shows an exemplary wave form comprising post-filtered sample values as might be processed by the Process Raw Data Routine 58 of the present invention. Sample points 302 represent values for Df2(t) (or its derivative if Slope Mode is selected) as sampled at time t. As the result of noise or other artifacts, values of Df2(t) (or its derivative) may exceed for some small period of time the pre-specified threshold 300. If the prior art ENDPOINT? Routine 60 of the prior art method (FIG. 6) were implemented in this case, the endpoint which would be detected would be premature and the etching process would be terminated prematurely.

Figure 10:
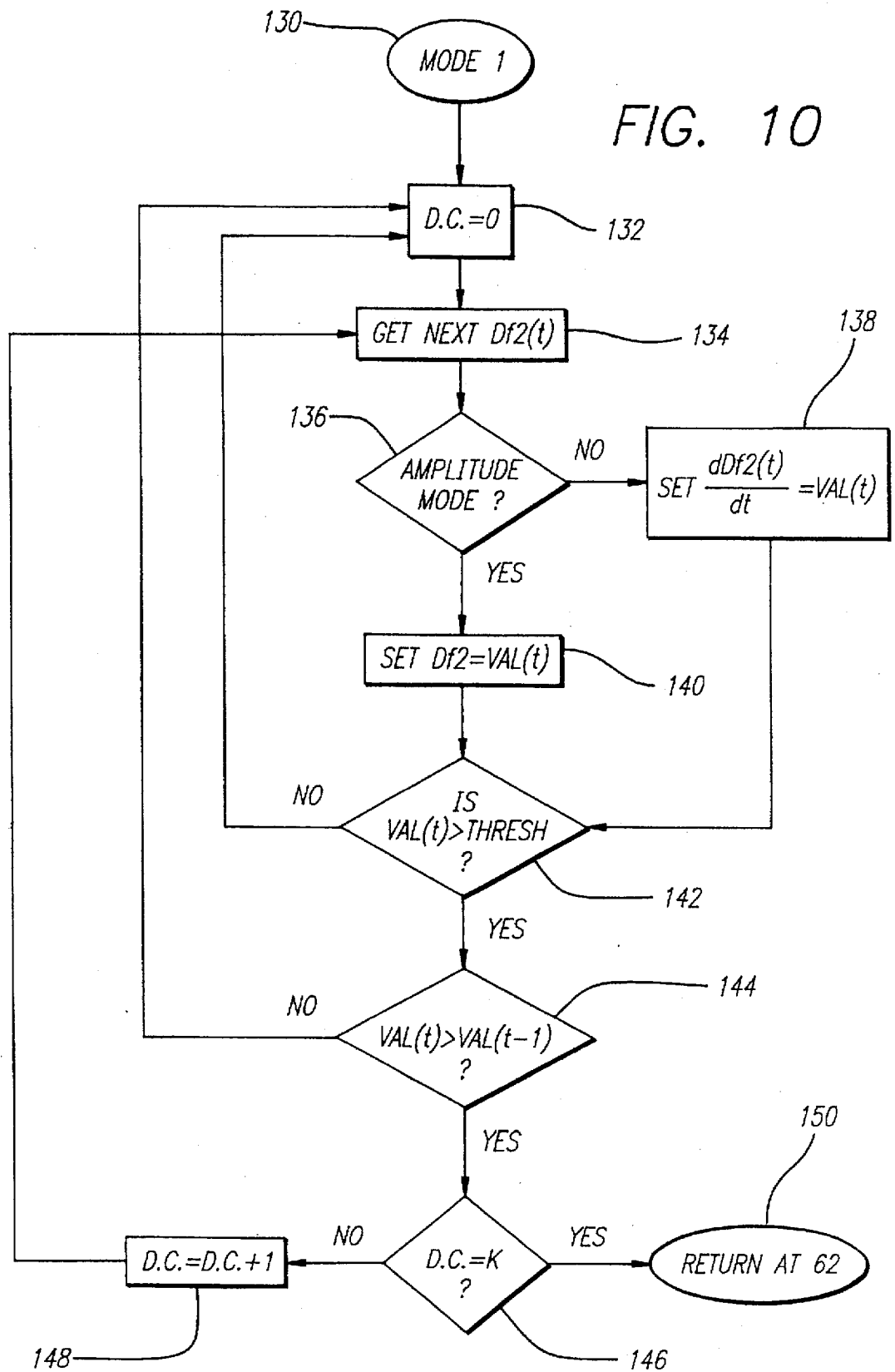
FIG. 10 is a flow chart representation of the Endpoint Detection/Mode 1 Routine of the method of the present invention.
Figure 11:
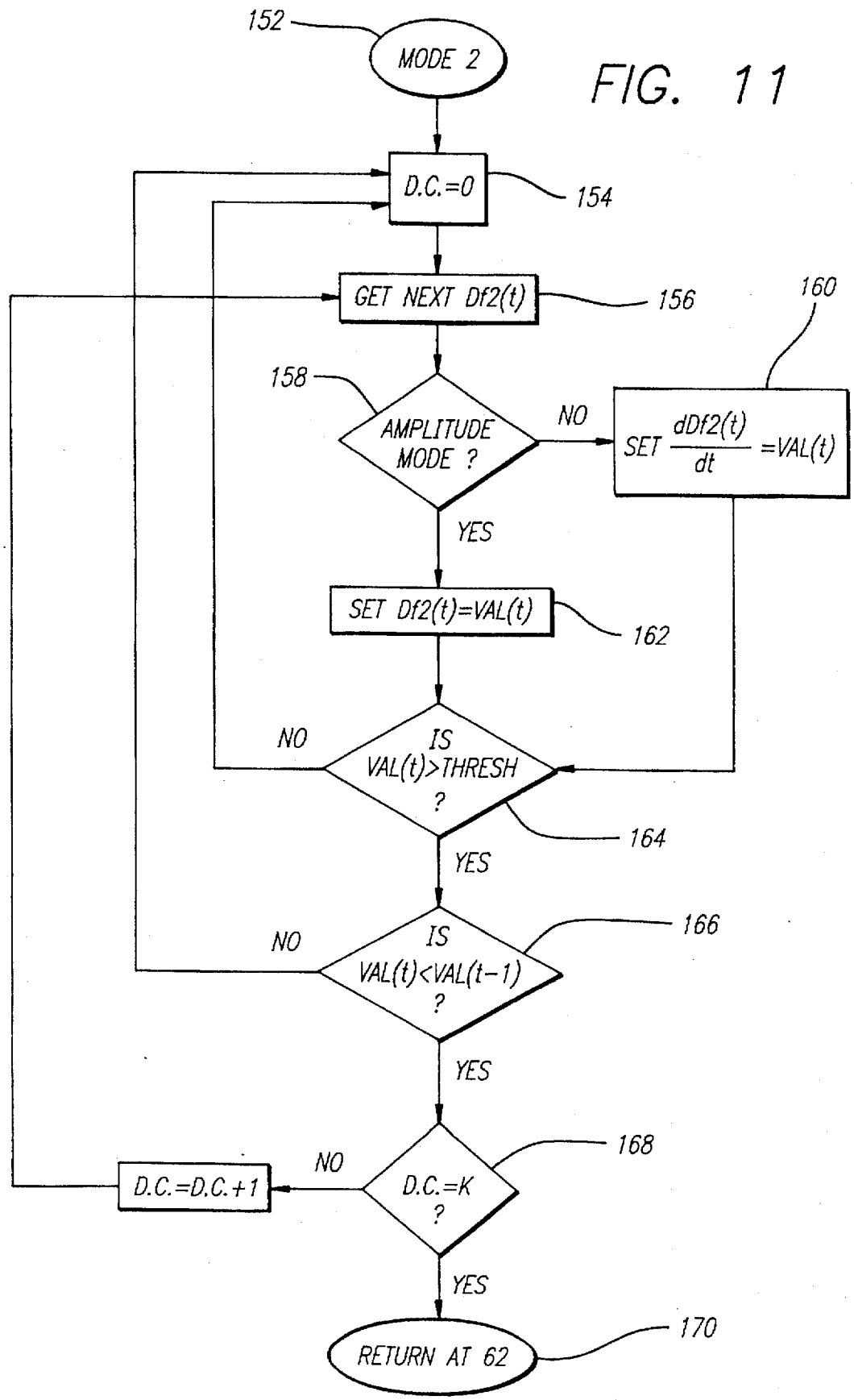
FIG. 11 is a flow chart representation of the Endpoint Detection/Mode 2 Routine of the method of present invention.
Figure 12:
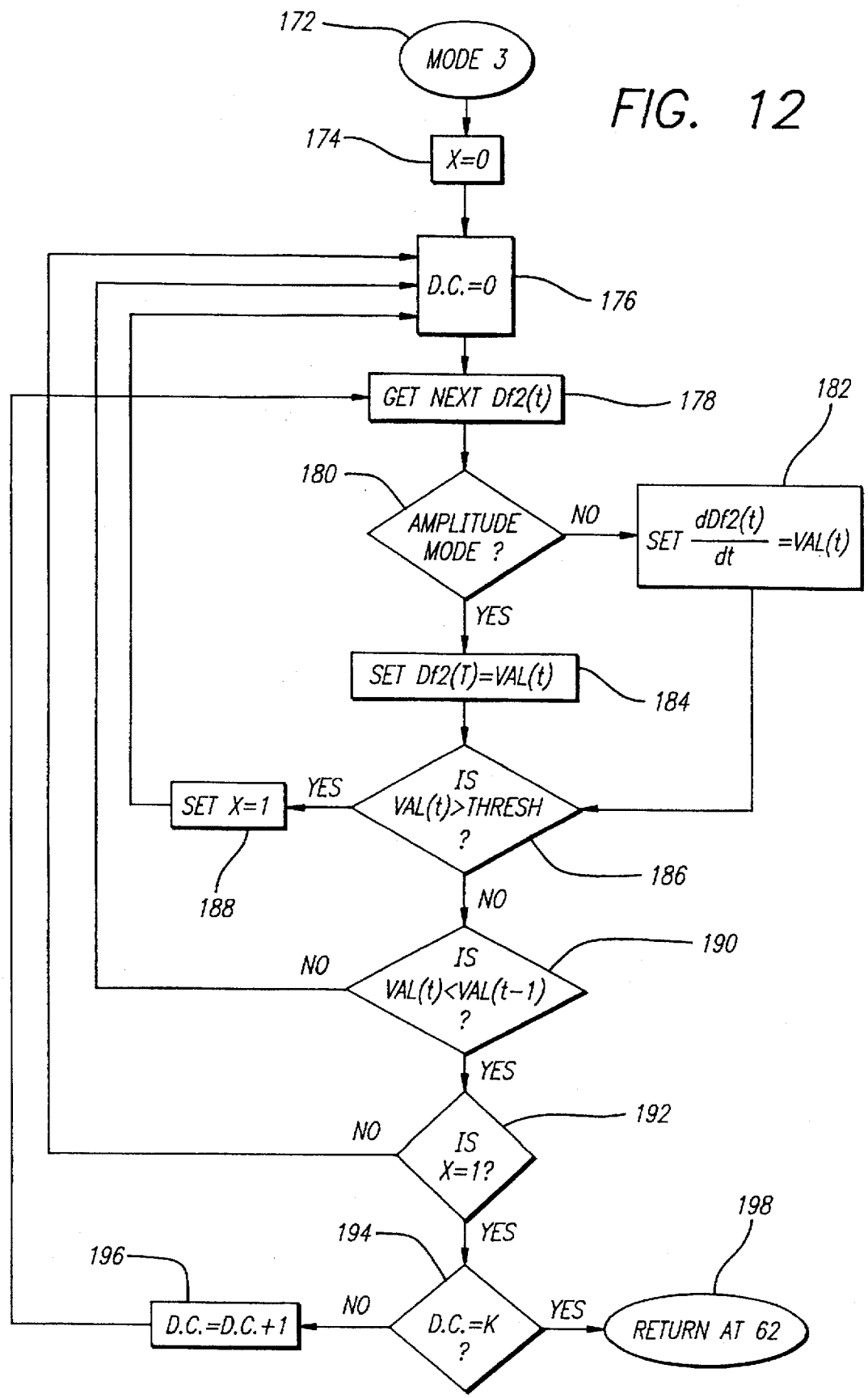
FIG. 12 is a flow chart representation of the Endpoint Detection/Mode 3 Routine of the method of the present invention.

The improved ENDPOINT? Routine 60 of the present invention is described in FIGS. 9 through 12. In the method of the present invention, one of three modes can be chosen for specifying the desired endpoint. The Mode 1 Routine 130, as depicted in FIG. 10 is used to detect an endpoint to be specified in the region 304 of FIG. 8. The Mode 2 Routine 152, as depicted in FIG. 11, is used to detect an endpoint which is specified in region 306 of FIG. 8. The Mode 3 Routine 172, as depicted in FIG. 12, is used to detect an endpoint which is specified in the region 308 of FIG. 8.

In establishing the endpoint to be detected, the process engineer therefore specifies not only a threshold, but also a mode and a parameter called the delay count (k). Specifying the mode specifies the region of the output wave-form in which the endpoint is to be detected. Specifying the delay count k defines the number of consecutive samples having certain characteristics which fall within the region defined by the mode. Thus, for the microcontroller to detect an endpoint in region 304 of the wave form of FIG. 8, the microcontroller must encounter k consecutive values of Df2(t) (or its derivative if Slope Mode is selected) which exceed the threshold and which successively increase in value. For the microcontroller to detect an endpoint in region 306 of the wave form of FIG. 8, the microcontroller must encounter k consecutive samples which are greater than the threshold and which are successively decreasing in value. For the microcontroller to detect an endpoint in region 308 of the wave form of FIG. 8, the microcontroller must encounter k consecutive values of Df2(t) or its derivative which are below the threshold value, which are successively decreasing in value relative to one another, and at some time t prior to the k samples, the value of Df2(t) had to have exceeded the threshold 300. Thus, if k is specified as 3 or greater, the ENDPOINT? Routine 60 of the present invention would not detect an endpoint for Region 310 of the wave form of FIG. 8. Although the values of Df2(t) (or its derivative) did exceed threshold 300, the number of samples never equal or exceed the delay count k equal to 3.

It will be recognized by those of skill in the art that the optimal delay count k will depend on the sampling rate and the width of noise spikes. Further, not only does the improved method of endpoint detection provide additional noise immunity for ensuring accurate and reliable endpoint detection, it also provides the process engineer much greater flexibility in specifying exactly where the endpoint should take place. The apparatus of the present invention is provided with sufficient memory to store the data generated by the endpoint detection process for each lot of wafers that are processed in the etch system. These results can be correlated with the actual process parameters by which performance of the semiconductor circuits is measured so that an optimal location for the endpoint can be derived empirically. The improved method of the present invention provides the process engineer the ability to make very fine adjustments to the endpoint location. Put another way, the process engineer does not have to rely on a single threshold by which to determine an endpoint, but can move the endpoint in time with gradations as small as the sampling period and thus adjust the etch time itself.

Figure 13:
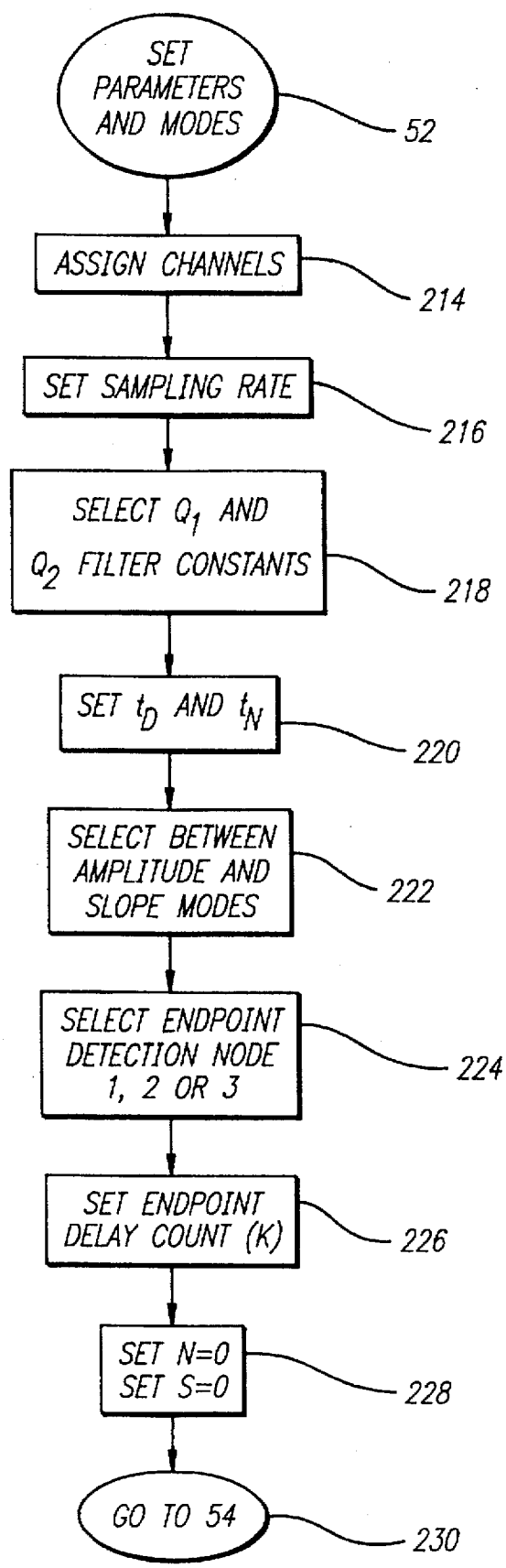
FIG. 13 is a flow chart representation of the Set Parameters And Modes Routine of the method of the present invention.

FIG. 13 illustrates the Set Parameters and Modes Routine 52 for the method of the present invention. The improved method requires the specification of additional parameters which are indicated in the Figure. In Step 220, the process engineer must not only set the delay or masking time $t_D$, but also the normalization time $t_N$ which defines the time during which an average normalization value $D_{an}$ is calculated. Step 224 requires the engineer to specify the mode of endpoint detection which, as previously discussed, defines the region of the post-filtered output wave form in which the endpoint is to be specified. Step 226 indicates that the process engineer must also set the delay count k for purposes of defining how many consecutive samples having the appropriate characteristics of the selected mode must be encountered by the microcontroller before recognizing an endpoint. Step 228 sets parameters N and S for use in the improved normalization and endpoint detection routines.

Figure 14:
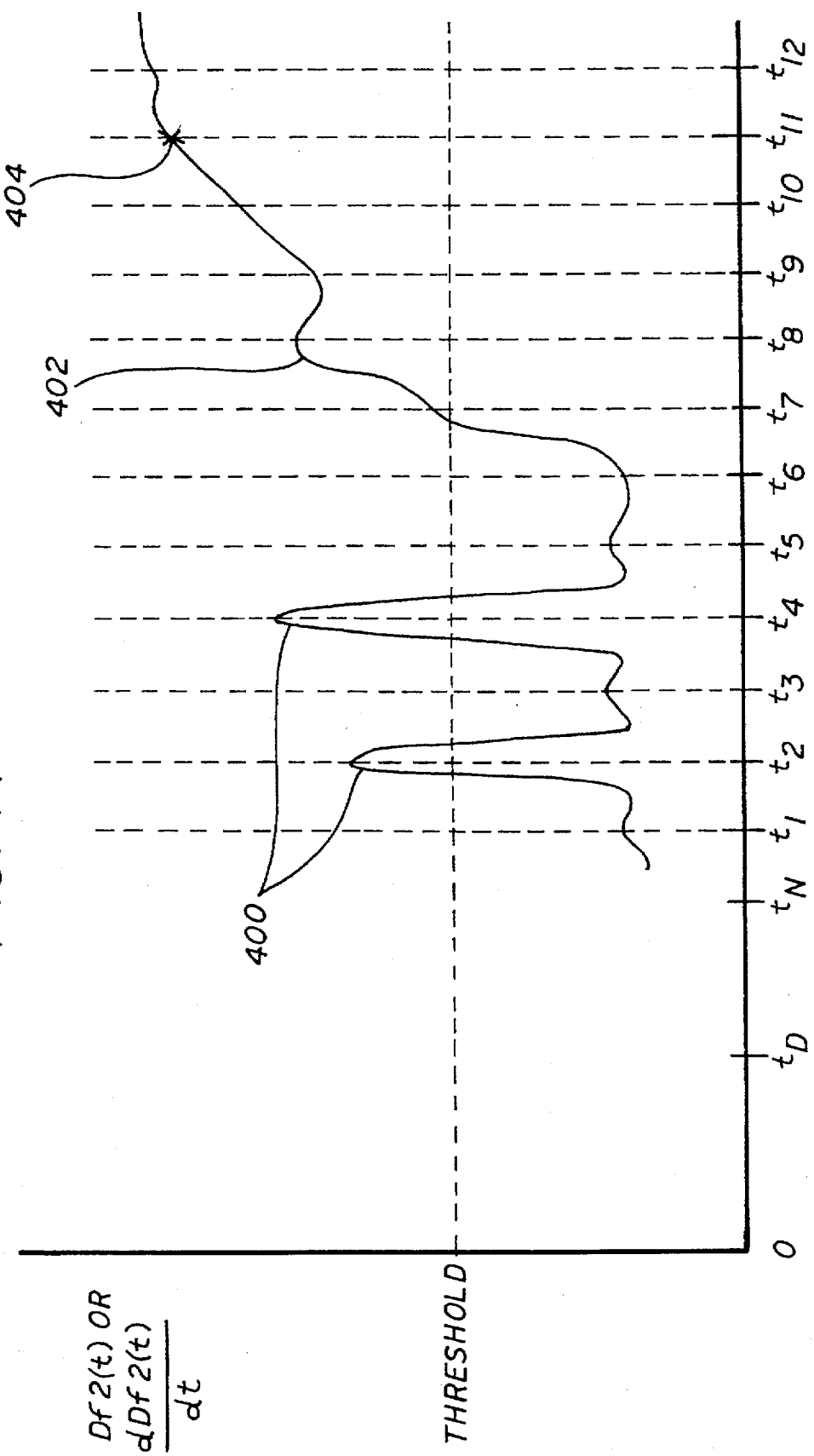
FIG. 14 is an illustration of the application of the Endpoint Detection Routine of the method of the present invention to a typical signal produced by the post-filter step of the method of the present invention.

FIG. 14 provides an additional illustration of the benefit of the method of the present invention. FIG. 14 illustrates an endpoint detection at time $t_{11}$, the endpoint specified by the selection of Mode 1 and having a delay count k equal to 3. The method of the present invention will not be fooled by noise spikes 400 or local maxima 402, but waits until endpoint 404 is reached before terminating the etch process.

SUMMARY

As described in the Specification, the present invention is an improved method by which the endpoint of a process such as plasma etching may be accurately and reliably specified and detected under conditions which degrade the signal-to-noise ratio. The method of the present invention is an improvement over a known prior art method of endpoint detection which fails to detect endpoints accurately and reliably under circumstances of low signal-to-noise ratio. The method of the present invention is capable of being implemented with an apparatus which is currently used in the art for implementing the prior art process. The improved method of the invention implements a unique and novel approach to specifying and detecting an endpoint which provides greater noise immunity than was possible with the prior art method. It is contemplated that this unique and novel approach to specifying and detecting endpoints will find application in other processes. For example, the method of the present invention could be applied to vapor deposition or any other process by which photo emissions of chemical species are measured to determine their levels of concentration and where the quantities of the species are small enough that the noise of the system tends to overwhelm the signal of interest. Although the present invention has been described with reference to a few exemplary FIGS. 1 through 14, it will be apparent that many alternatives, modifications and variations may be made in light of the foregoing description.

I claim:

1. A method of detecting an endpoint for terminating a chemical process involving one or more chemical species, the process taking place in a chamber, said method comprising the steps of:

defining the endpoint in the form of a mode, a minimum value of a delay count and a threshold;

initiating the chemical process;

detecting intensity of light emitted during the chemical process by one or more of the one or more species in the form of an analog signal representing the intensity of each of the detected species;

sampling each analog signal at a rate and at the beginning of a current sampling period defined by the rate to produce a set of raw data samples for the current sampling period;

pre-filtering each of the set of raw data samples of the current sampling period;

normalizing each of the set of pre-filtered data samples;

auto-correlating the set of normalized data samples to produce a multichannel value for the current sampling period;

post-filtering the multichannel value;

incrementing the delay count when the threshold has been exceeded by the post-filtered multichannel value and the mode is met, otherwise setting the delay count equal to zero; and repeating said pre-filtering, normalizing, auto-correlating, post-filtering, and incrementing steps for each set of raw data samples until the delay count reaches or exceeds the minimum value; and terminating the process when the delay count reaches or exceeds the minimum value.

2. The method of claim 1 wherein the mode is met when the post-filtered multichannel value of an immediately preceding sampling period is less than the post-filtered multichannel value of the current sampling period.

3. The method of claim 1 wherein the mode is met when the post-filtered multichannel value of an immediately preceding sampling period is greater than the post-filtered multichannel value of the current sampling period.

4. The method of claim 1 wherein the mode is met when the post-filtered multichannel value of the current sampling period is less than the threshold and is less than the post-filtered multichannel value of an immediately preceding sampling period.

5. The method of claim 1 wherein said step of normalizing each of the set of pre-filtered data samples further comprises the steps of:

calculating an average normalization value corresponding to each of the sampled analog signals; and dividing each of the set of pre-filtered data samples by the average normalization value corresponding to the analog signal from which each of the pre-filtered samples was taken.

6. The method of claim 5 wherein said step of normalizing is not performed for a first period of time with reference to a time at which the process is initiated.

7. The method of claim 6 wherein said step of dividing is not performed for a second period of time with reference to lapse of the first period of time.

8. The method of claim 7 wherein said step of calculating further comprises the steps of:
   during the second period of time, summing together pre-filtered data samples taken from each of the sampled analog signals; and
   dividing each of the summations by a total number of samples taken during the second predetermined period of time to produce the average normalization values corresponding to each of the sampled analog signals.

9. The method of claim 1 wherein said step of sampling each analog signal further comprises the steps of:
   capturing a raw analog data sample of the amplitude of each analog signal; and
   converting each of the raw analog samples to a raw digital data sample.

10. The method of claim 1 wherein said step of pre-filtering each of the raw data samples further comprises the step of calculating the pre-filtered data samples in accordance with the equation $Df1(t)=(1-Q1)\times Df1(t-1)+Q1\times D1(t)$, wherein $Df1(t)$ is the pre-filtered data sample being currently calculated, Q1 is a pre-filter constant, $Df1(t-1)$ is the pre-filtered data sample calculated during a preceding sampling period.

11. The method of claim 1 wherein said step of auto-correlating further comprises the step of calculating the multichannel value in accordance with the equation $MCA(t)=[(A-B)+(C-D)]+(E)$, where A, B, C, D and E represent up to five of the normalized data samples, and $MCA(t)$ is the multichannel value being calculated.

12. The method of claim 1 wherein said step of post-filtering the multichannel value further comprises the step of calculating the post-filtered multichannel value in accordance with the equation $Df2(t)=(1-Q2)\times Df2(t-1)+Q2\times MCA(t)$, wherein $Df2(t)$ is the post-filtered multichannel value of the current sampling period, Q2 is a post-filtering constant, $Df2(t-1)$ is the post-filtered multichannel value of a preceding sampling period and $MCA(t)$ is the multichannel value of the current sampling period.

13. The method of claim 1, 2, 3 or 4 wherein the derivative of the post-filtered multichannel value is used to determine whether the threshold has been exceeded and whether the mode has been met.

14. An apparatus for detecting an endpoint at which to terminate a chemical process involving one or more chemical species, the process taking place in a chamber, said apparatus comprising:
   means for defining the endpoint in the form of a mode, a minimum value of a delay count and a threshold;
   means for initiating the chemical process;
   means for detecting intensity of light emitted during the chemical process by one or more of the one or more species in the form of an analog signal representing the intensity of each of the detected species;
   means for sampling each analog signal at a rate and at the beginning of a current sampling period defined by the rate to produce a set of raw data samples for the current sampling period;
   means for pre-filtering each of the set of raw data samples of the current sampling period;
   means for normalizing each of the set of pre-filtered data samples;
   means for auto-correlating the set of normalized data samples to produce a multichannel value for the current sampling period;
   means for post-filtering the multichannel value;
   means for incrementing the delay count when the threshold has been exceeded by the post-filtered multichannel value and the mode is met, otherwise setting the delay count equal to zero; and
   means for terminating the process when the delay count reaches or exceeds the minimum value.

15. The apparatus of claim 14 wherein the mode is met when the post-filtered multichannel value of an immediately preceding sampling period is less than the post-filtered multichannel value of the current sampling period.

16. The apparatus of claim 14 wherein the mode is met when the post-filtered multichannel value of an immediately preceding sampling period is greater than the post-filtered multichannel value of the current sampling period.

17. The apparatus of claim 14 wherein the mode is met when the post-filtered multichannel value of the current sampling period is less than the threshold and is less than the post-filtered multichannel value of an immediately preceding sampling period.

18. The apparatus of claim 14 wherein said means for normalizing each of the set of pre-filtered data samples further comprises:
   means for calculating an average normalization value corresponding to each of the sampled analog signals; and
   means for dividing each of the set of pre-filtered data samples by the average normalization value corresponding to the analog signal from which each of the pre-filtered samples was taken.

19. The apparatus of claim 18 wherein said means for normalizing does not normalize the pre-filtered data samples for a first period of time with reference to a time at which the process is initiated.

20. The apparatus of claim 19 wherein said means for calculating calculates the average normalization values during a second period of time with reference to lapse of the first period of time.

21. The apparatus of claim 20 wherein said means for calculating further comprises:
   means for summing together pre-filtered data samples taken from each of the sampled analog signals; and
   means for dividing each of the summations by a total number of samples taken during the second period of time to produce the average normalization values corresponding to each of the sampled analog signals.

22. The apparatus of claim 14 wherein said means for sampling each analog signal further comprises:
   means for capturing a raw analog data sample of the amplitude of each analog signal; and
   means for converting each of the raw analog samples to a raw digital data sample.

23. The aparatus of claim 14 wherein said means for pre-filtering each of the raw data samples further comprises means for calculating the pre-filtered data samples in accordance with the equation $Df1(t)=(1-Q1)\times Df1(t-1)+Q1\times D1(t)$, wherein $Df1(t)$ is the pre-filtered data sample being currently calculated, Q1 is a pre-filter constant, $Df1(t-1)$ is the pre-filtered data sample calculated during a preceding sampling period.

24. The apparatus of claim 14 wherein said means for auto-correlating further comprises means for calculating the multichannel value in accordance with the equation $MCA(t)=[(A-B)+(C-D)]+(E)$, where A, B, C, D and E represent up to five of the normalized data samples, and $MCA(t)$ is the multichannel value being calculated.

25. The apparatus of claim 14 wherein said means for post-filtering the multichannel value further comprises means for calculating the post-filtered multichannel value in accordance with the equation $Df2(t)=(1-Q2) \times Df2(t-1) + Q2 \times MCA(t)$, wherein $Df2(t)$ is the post-filtered multichannel value of the current sampling period, Q2 is a post-filtering constant, $Df2(t-1)$ is the post-filtered multichannel value of a preceding sampling period and $MCA(t)$ is the multichannel value of the current sampling period.

26. The apparatus of claim 14, 15, 16 or 17 wherein the derivative of the post-filtered multichannel value is used to determine whether the threshold has been exceeded and whether the mode has been met.

* * * * *